(12) United States Patent
Abraham et al.

(10) Patent No.: US 9,754,427 B2
(45) Date of Patent: Sep. 5, 2017

(54) BLACK BOX RECORDER WITH SATELLITE TRANSMITTER (BSAT) FOR UNDERWATER VEHICLES

(71) Applicant: THE DIRECTOR GENERAL, DEFENCE RESEARCH & DEVELOPMENT ORGANISATION (DRDO), New Delhi (IN)

(72) Inventors: Varughese Abraham, Visakhapatnam (IN); Mailapalli Nirmala, Visakhapatnam (IN); Prasad Parvathaneni Shiva, Visakhapatnam (IN); Attara Sanjay, Ahmedabad (IN); Chakraborti Debasish, Visakhapatnam (IN)

(73) Assignee: THE DIRECTOR GENERAL, DEFENCE RESEARCH & DEVELOPMENT ORGANISATION (DRDO), New Delhi (IN)

( * ) Notice: Subject to any disclaimer, the term of this patent is extended or adjusted under 35 U.S.C. 154(b) by 72 days.

(21) Appl. No.: 14/907,398

(22) PCT Filed: Jul. 30, 2014

(86) PCT No.: PCT/IB2014/063538
§ 371 (c)(1),
(2) Date: Jan. 25, 2016

(87) PCT Pub. No.: WO2015/015429
PCT Pub. Date: Feb. 5, 2015

(65) Prior Publication Data
US 2016/0171790 A1   Jun. 16, 2016

(30) Foreign Application Priority Data
Jul. 31, 2013 (IN) .......................... 2302/DEL/2013

(51) Int. Cl.
*G01M 17/00* (2006.01)
*G07C 5/00* (2006.01)
(Continued)

(52) U.S. Cl.
CPC ............... *G07C 5/008* (2013.01); *B63G 8/40* (2013.01); *B63G 8/41* (2013.01); *G01S 19/03* (2013.01);
(Continued)

(58) Field of Classification Search
CPC ......... G07C 5/008; G07C 5/085; G01S 19/03; B63G 8/40; B63G 8/41; H05K 5/0213
(Continued)

(56) References Cited

U.S. PATENT DOCUMENTS 3,933,109 A    1/1976  Boisrayon et al.
6,153,720 A *  11/2000 Olzak .................. H05K 5/0213
                                                   528/182
(Continued)

FOREIGN PATENT DOCUMENTS

JP    2003-137194 A    5/2003

OTHER PUBLICATIONS

International Search Report and Written Opinion of the ISA, ISA/EP, Rijswijk, NL, mailed Dec. 8, 2014.

*Primary Examiner* — Thomas G Black
*Assistant Examiner* — Luke Huynh
(74) *Attorney, Agent, or Firm* — Harness, Dickey & Pierce, P.L.C.

(57) ABSTRACT

Embodiments of the present disclosure disclose a Black box with Satellite Transmitter (BSAT) for underwater vehicles. The BSAT provides a mission data backup of sunken under water vehicles and it is akin to a black box recorder of aircrafts. The BSAT comprising a sealed enclosure to receive and transmit IR and electromagnetic signals, a
(Continued)

Global Positioning System (GPS) with an antenna to provide GPS parameters of the BSAT, a transmit antenna to transmit the GPS parameters and parameters associated with the underwater vehicle, an ejection mechanism to eject the BSAT from the underwater vehicle on detecting a predefined condition, by an electronic controller. The electronic controller to perform at least one of sending control signals, communicating using IR transceiver, acquire and store underwater vehicle parameters, identifying an ejection instant, acquiring and storing data GPS parameters, scheduling data transmission through a satellite after ejection of the BSAT from the underwater vehicle.

12 Claims, 7 Drawing Sheets

(51) Int. Cl.
  *B63G 8/41* (2006.01)
  *H05K 5/02* (2006.01)
  *B63G 8/40* (2006.01)
  *G01S 19/03* (2010.01)
  *G07C 5/08* (2006.01)
  *B63C 9/00* (2006.01)

(52) U.S. Cl.
  CPC ........... *G07C 5/085* (2013.01); *H05K 5/0213* (2013.01); *B63C 2009/0017* (2013.01)

(58) Field of Classification Search
  USPC ................................ 701/32.4, 33.4; 340/850
  See application file for complete search history.

(56) References Cited

U.S. PATENT DOCUMENTS

| | | | |
|---|---|---|---|
| 6,898,492 B2 * | 5/2005 | de Leon ................. | G07C 5/008 244/189 |
| 8,670,879 B1 * | 3/2014 | Angelucci ............. | B64D 45/00 244/1 R |
| 9,102,388 B2 * | 8/2015 | Lee .......................... | B63C 9/00 |
| 2012/0097823 A1 | 4/2012 | Murray et al. | |
| 2012/0105247 A1 * | 5/2012 | Kwong ................. | H04B 13/02 340/850 |
| 2012/0232746 A1 * | 9/2012 | Wiederwohl ......... | G07C 5/085 701/33.4 |

* cited by examiner

BLACK BOX RECORDER WITH SATELLITE TRANSMITTER (BSAT) FOR UNDERWATER VEHICLES

CROSS-REFERENCE TO RELATED APPLICATIONS

This application is a 371 U.S. National Stage of International Application No. PCT/IB2014/063538, filed Jul. 30, 2014, which claims the benefit of and priority to Indian Patent Application No. 2302/DEL/2013, filed Jul. 31, 2013. The entire disclosures of both of the above applications are incorporated herein by reference.

FIELD OF INVENTION

This invention relates to vehicle monitoring systems and more particularly to a Black box with Satellite Transmitter (BSAT) for underwater vehicles.

BACKGROUND

Disasters are so common in the world of air borne applications, terrestrial applications and under water applications. The causes of these disasters should be analyzed and addressed, so that improved and flawless systems can be delivered. The reasons could be known, only if the mission data recorded. Further it should be available, even though the main systems are destroyed. It is mandatory to record the data in every aircrafts, terrestrial systems and under water applications.

The term 'black box' is most commonly used to describe the computerized flight Data Recorders (FDR) carried by aircraft. A black box recorder may be considered to be an electronic device employed to record specific aircraft parameters; for example, any instructions sent to any electronic systems on an aircraft. Another kind of flight recorder is the cockpit voice recorder (CVR) which records conversation in the cockpit, radio communications between the cockpit crew and others (including conversation with air traffic personnel, as well as ambient sounds). They record significant flight parameters, including the control and actuator positions, engine information and time of day. There are 88 parameters required as a minimum under the U.S. federal regulations (only 29 were required until 2002), but some systems monitor many more variables. Generally, each parameter is recorded a few times per second, though some units store "bursts" of data at a much higher frequency if the data has a tendency to change quickly.

Standard black box components comprise a power supply, a memory unit, electronic controller board, input devices, and a signal beacon.

In the event of a mishap, data stored in the black box can provide indispensable help in understanding the dynamics and underlying cause of an accident. The key to manufacturing a successful black box is to make it maintenance free and as indestructible as possible. However, currently black box technologies are being used in Aircrafts only.

However, in the case of underwater vehicles, performance evaluation is done offline as on line data transmission is not possible because of the heavy attenuation of the signals over the sea. Therefore, real time mission data will be stored in a non-volatile memory present in the vehicle and data will be retrieved on completion of mission on the bench to analyze the vehicle performance. All this could happen, if there is no abnormal condition in the vehicle. If there is an accident, there may be loss of the mission data, as the vehicle may sink. It would be difficult to retrieve the mission data, in terms of time, finances and effort.

US20120105247 refers to systems and methods for reporting activities at certain location below sea level. It discloses a flight recorder system for collecting and reporting at specific locations below sea level. The housing consists of GPS receiver which locates information in connection with positions above the sea level only. A physical communication link is present between the black box and the housing. This invention is meant for aircrafts only when the aircraft has crashed into the ocean, the black box is within the flight itself. Also there is no discussion about the ejection details of the housing.

US20120097823 refers to a floating data recorder associated with a drilling rig in ocean. The system includes a hardened memory device containing drilling data, a beacon device to aid in locating the hardened memory. The embodiment is meant for drilling rigs in the ocean. The ejection mechanism is a hydrostatic release. The hardened memory device itself does not float in the water. There is an arm sort of device with cradle to float the hardened memory device. This invention is not meant for static systems only and not for high speed under water moving vehicles.

OBJECT OF INVENTION

The principal object of this invention is to provide a mission data backup of sunken under water vehicles.

Another objective of the invention is to provide a three pins conducting logic on the BSAT enclosure to switch ON the power to the BSAT when it is mission mode and charging of the internal batteries without disassembling the system when it is connected with charger.

Another objective of the invention is to provide mechanism to receive the underwater vehicle mission data in contact less media via IR communication through Perspex (under water vehicle enclosure)-seawater-Perspex (BSAT enclosure) as a physical media.

Another objective of the invention is to provide acquisition of position information with Time To First Fix (TTFF) of 40 sec even in rough sea states below 4 (sea water splashes over the BSAT GPS antenna).

Another object of the invention is to provide a satellite based recovery means for the BSAT in rough sea environment with sea state less than 4, once the BSAT floats on sea water after its ejection from the underwater vehicle.

Another object of the invention is to provide an ejection mechanism for the BSAT.

SUMMARY

Accordingly the invention discloses a Black box with Satellite Transmitter (BSAT) for an underwater vehicle, the BSAT placed in a sealed enclosure, wherein the BSAT comprises of an electronic controller; an Infrared (IR) interface; a Global Positioning System (GPS) comprising of a high sensitivity receiving chip; and an antenna; a satellite transmitting antenna; a conducting logic comprising of three pins; a memory to store data; a rechargeable battery; and an ejection means to eject the BSAT, on detecting a pre-defined condition in the underwater vehicle.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF FIGURES

This invention is illustrated in the accompanying drawings, through out which like reference letters indicate corresponding parts in the various figures. The embodiments herein will be better understood from the following description with reference to the drawings, in which.

DETAILED DESCRIPTION OF INVENTION

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide a black box recorder with Satellite Transmitter (BSAT) for under water vehicles. Referring now to the drawings, and more particularly to FIGS. 1 through 6, where similar reference characters denote corresponding features consistently throughout the figures, there are shown preferred embodiments.

Embodiments herein disclosed a Black box with satellite Transmitter (BSAT) for underwater vehicles, wherein the BSAT is a standalone system without any external connections. The BSAT is a micro controller based compact, rugged and waterproof system designed for under water applications.

Figure 1:
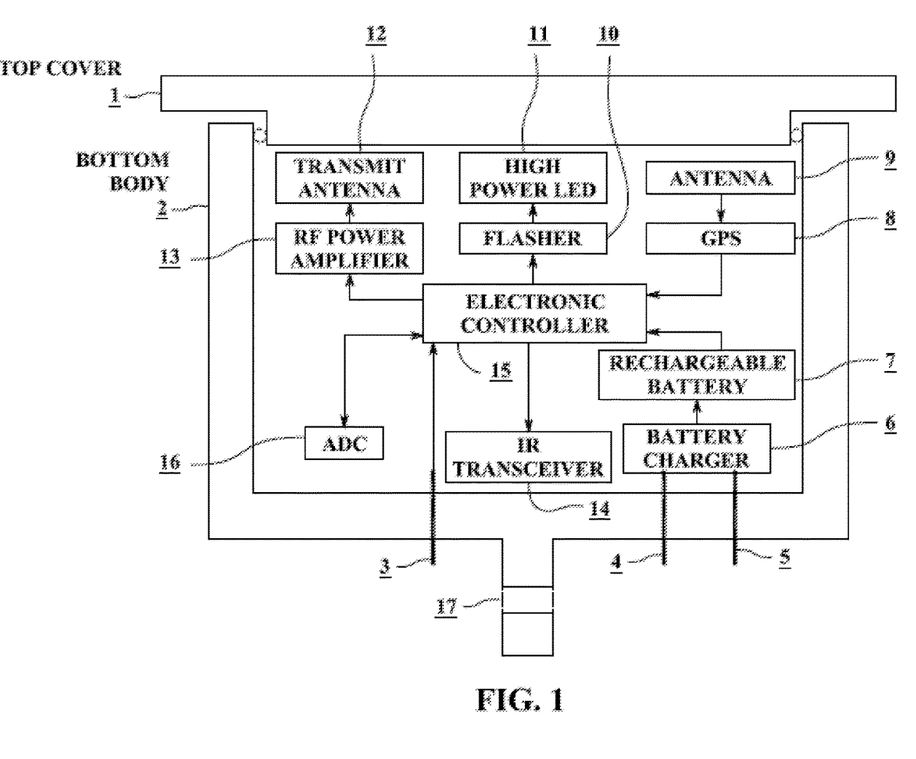
FIG. 1 depicts the placement of hardware inside the BSAT, according to embodiments as disclosed herein.

FIG. 1 depicts the placement of hardware inside the BSAT, according to embodiments as disclosed herein. The BSAT comprises of a sealed enclosure with a top cover 01 and a bottom body 02 which houses a GPS receiver 08 with a patch antenna 09 placed at the top, which can locate its position through satellite. The enclosure may be made up of perspex/polycarbonate or any other material transparent to Infrared (IR) and Radio Frequency (RF) signals. The BSAT also comprises of a transmitting antenna 12 with a power amplifier 13 to transmit GPS parameters and other critical parameters of torpedo to satellite. The antenna may be an S-band antenna. The BSAT comprises of an electronic controller 15 for GPS acquisition, transmission message scheduling, IR data reception and implementation of 3 pin logics. The BAST comprises high power rating rechargeable batteries 07 for long time operations. An Infrared (IR) transceiver 14 is present at the bottom of the unit to communicate with the vehicles. The BSAT also has on board flash memory 10 to store system parameters and records received form torpedo. The ADC 16 is present to monitor the status of internal battery. The BSAT can be assembled in vehicles with a housing 23. The housing comprises of an ejection mechanism 32 to eject the BSAT in the case of a pre-determined threshold occurring during disasters. The BSAT further comprises a high intensity light as an alternate recovery aid.

Figure 2:
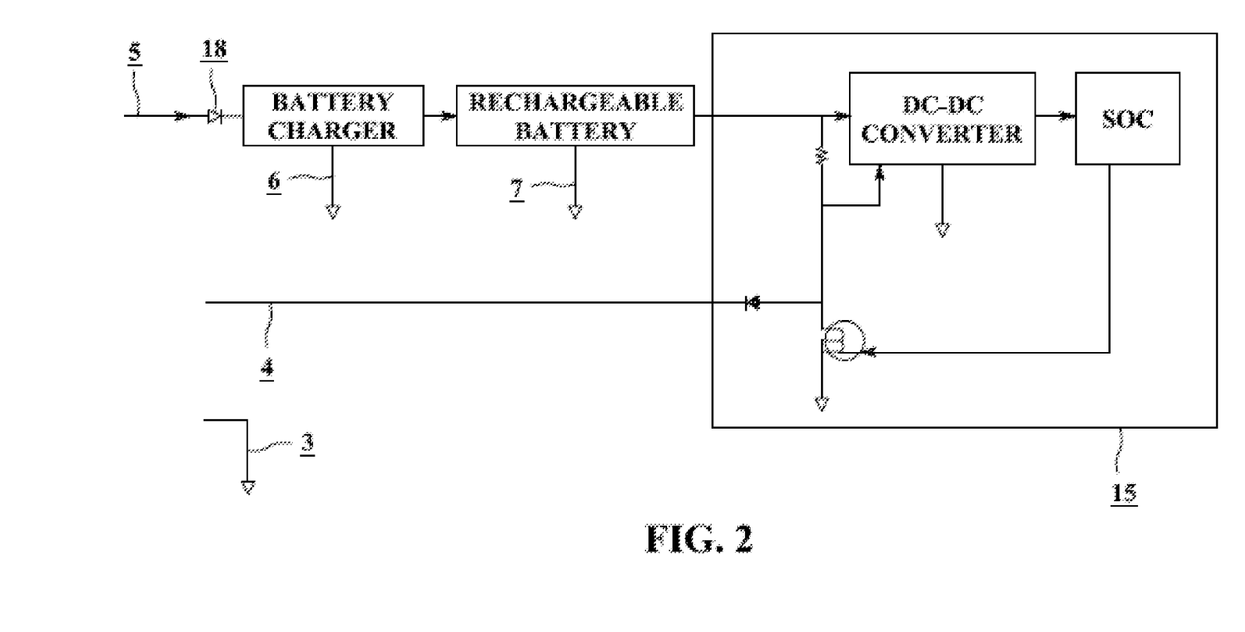
FIG. 2 depicts the three conducing pins logic implemented in the BSAT, according to embodiments as disclosed herein.

FIG. 2 depicts the three conducing pins logic implemented in the BSAT, according to embodiments as disclosed herein. On the surface of the BSAT enclosure, three conducting pins are located. In order to avoid attenuation of GPS signals, these pins are planned at the bottom of the enclosure. These pins detect water contact in mission mode and will also be used for battery charging in bench mode. When the underwater vehicle comes in contact with water, pin 1 05 and pin2 04 will be shorted through water conductivity. So BSAT will be switched over from sleep mode to active mode. It starts responding to commands using IR communication means. Data exchanged through IR communication comprises of either command or data. These two are differentiated by header bytes. BSAT will respond to commands, based on the demand and records the data if it is data pertaining to the vehicle.

BSAT comprises a built-in high power battery 07 which can enable the BSAT to transmit up to 15 hours. These batteries can be charged without opening the BSAT. Battery can be charged by connecting 8V dc supply to pin 2 04 and pin 3 03.

The ejection mechanism of the torpedo comprises a spring which locks the BSAT to the housing. The spring can be operated by using a squib. As long as underwater vehicle is in healthy condition, BSAT housing holds the BSAT. In case of any abnormal condition in under water vehicle, squib may be fired to release the BSAT from the housing.

Consider an exemplary event such as the sinking of the underwater vehicle. So when the vehicle starts sinking, a depth switch (which can be used for adjusting desired depths) will be closed and switches on power to squib. The squib will be fired and release the spring. The release of spring ejects the BSAT leaving the housing in the vehicle. Because of its positive buoyancy, the BSAT floats in water. The ejection of the BSAT from the housing causes a break in the IR communication. The BSAT detects the ejection event based on absence of IR communication for a predetermined time. The ejection event may be an incident such as the vehicle going below a pre-specified threshold, a fuel leak in the vehicle, an electrical problem in the vehicle, an explosion, no communication between the BSAT and the main recorder for a pre-configured time or any other incident which may result in damage to the vehicle. The ejection mechanism may also be triggered by an authorized person. Once ejected, because of the positive buoyancy, BSAT floats on water. It starts GPS acquisition and schedules the transmission of messages to the satellite containing position information and torpedo critical data. This information can be received by hub station in C-band hub station and BSAT can be located and recovered.

Figure 3:
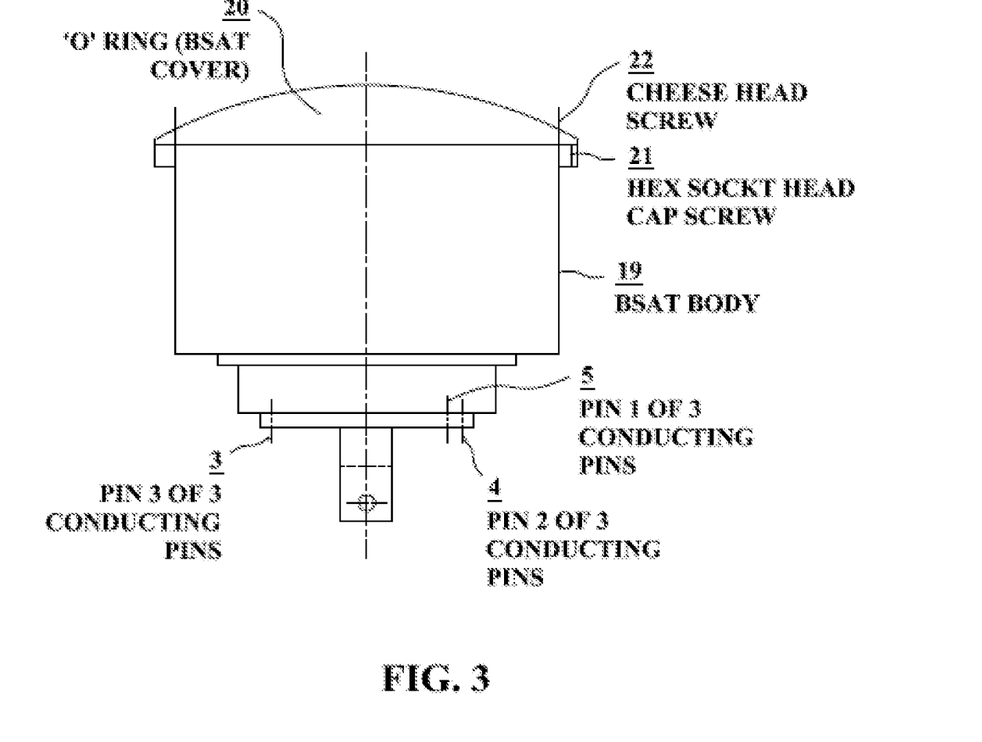
FIG. 3 depicts the cross section of BSAT, according to embodiments as disclosed herein.

Being a satellite based system, BSAT overcomes the hurdles like line of sight involved in conventional beacons FIG. 3 depicts the cross section of BSAT, according to embodiments as disclosed herein.

Figure 4:
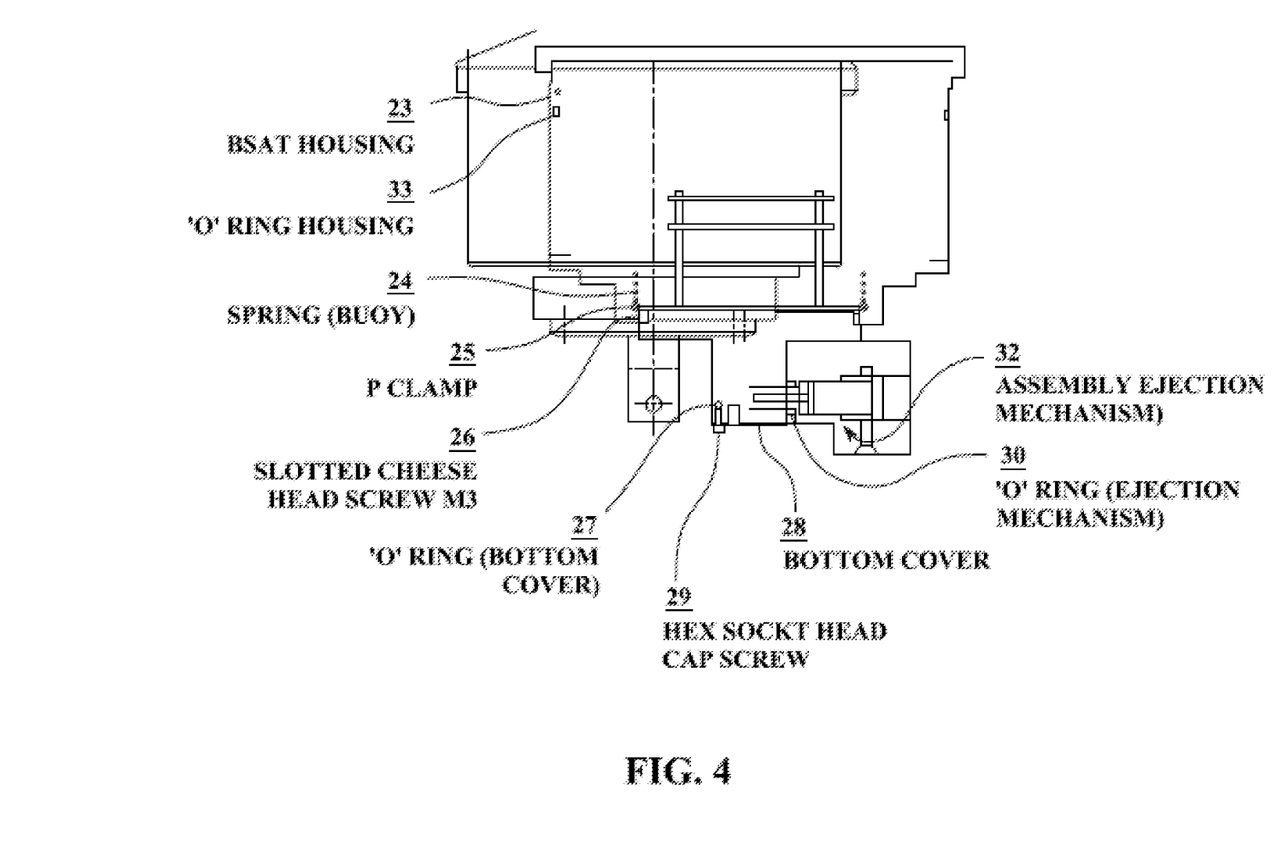
FIG. 4 depicts the cross section of BSAT with the housing, according to embodiments as disclosed herein.

FIG. 4 depicts the cross section of BSAT with the housing, according to embodiments as disclosed herein.

Figure 5A:
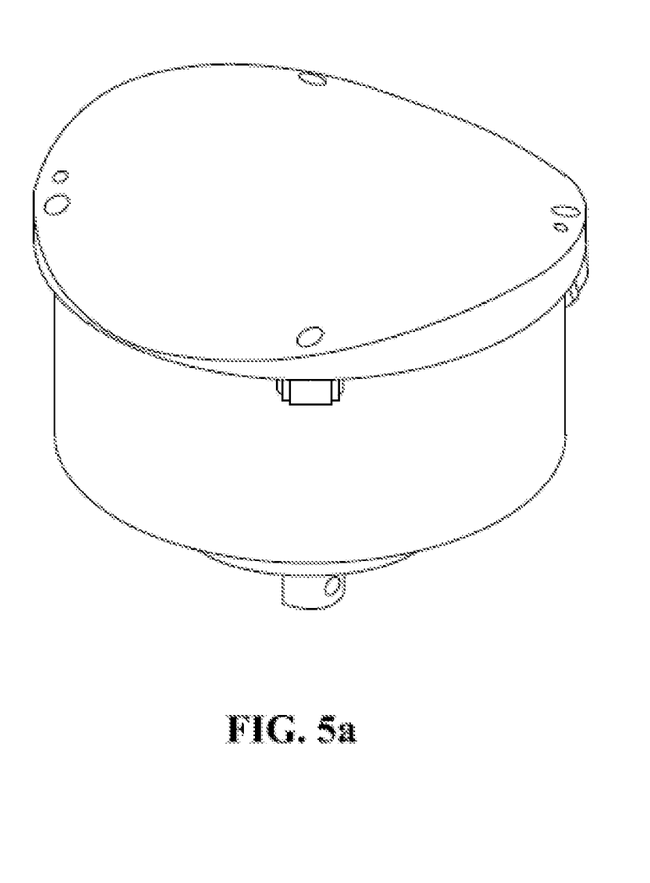
FIGS. 5a, 5b and 5c depict the 3 side view, 3D top view and 3D inner view of the BSAT respectively, according to embodiments as disclosed herein.
Figure 5B:
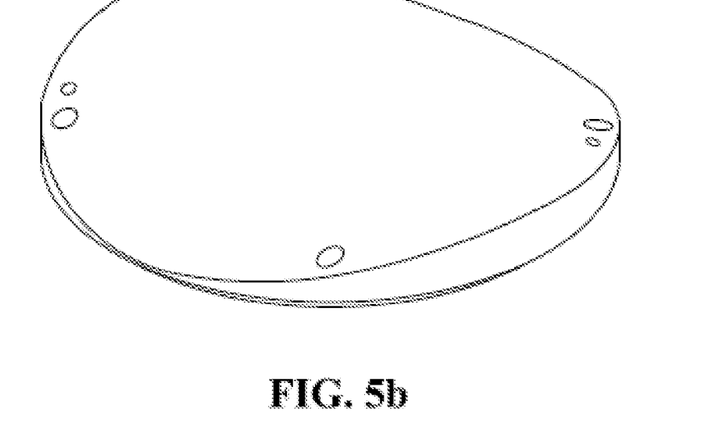
Figure 5C:
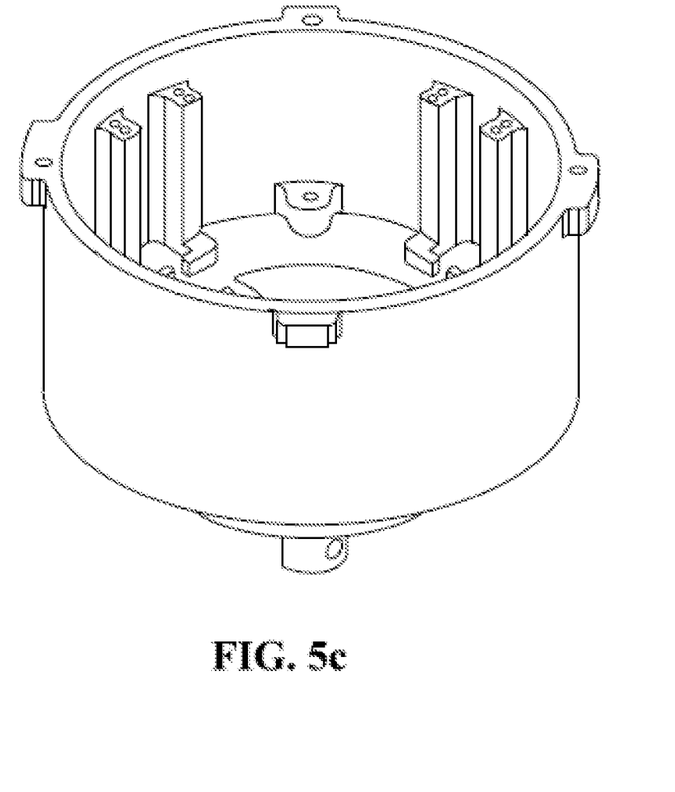

FIGS. 5a, 5b and 5c depict the 3d side view, 3D top view and 3D inner view of the BSAT respectively, according to embodiments as disclosed herein.

On powering ON the BSAT, the BSAT checks whether to enter into real time mode by waiting for a pre-defined time period. If a download command is received before the pre-defined time period, the BSAT enters into a download mode. In the download mode, the BSAT downloads the recorded data to a device on wireless means. If the download command is not received within the pre-defined time period, the BSAT enters into acquisition mode. Again in this mode, BSAT enters into monitor mode; if the data received is command type otherwise it will enter into mission mode. In monitor mode, BSAT configures system parameters. The system parameters comprise of Status of BSAT: By selecting the, "Get All parameters" command form GUI, status of all the parameters can be read.

Bench test ON/OFF: Default mode is Bench test OFF. Bench test is off normally after power on; it can be turned on using configuration software. After bench test ON, 142 bytes of information data had to be sent to BSAT unit. BSAT will send this data back to PC through IR transmitter.

Control of LED blinking: LED blinking can be controlled to save the power. LED blink status ON or OFF depends on previous settings. If LED status is OFF it can be turned ON by selecting the LED blink control from GUI. Once LED blinking is turned on, RED LED will blink once every minute indicating the BSAT is ON. BLUE led will blink every time some data comes on IR receiver. BLUE led will also blink during record down loading on PC. LED blink can be turned off by clinking on same button. The BSAT will remember LED blink status even after power off.

IR TIME OUT ENABLE/DISABLE: By default, IR time Out is enabled after power ON. IR time out can be disabled by clicking on enable button, once IR time out is disabled, the BSAT will not go in transmission mode until either IR timeout is enabled again or eject command is received.

Programming of carrier frequency: Any transmission carrier frequency can be selected in the range of 2670.00 MHz to 2690.00 MHZ by selecting the RF frequency icon from GUI. The BSAT will save change of frequency in memory.

IR TIMEOUT DELAY: User can enter time out duration in text box. Default IR timeout delay is 60 seconds. The BSAT will save IR time out delay change in memory.

Eject delay: User can set eject delay in seconds. This will delay ejection for delay set by user. Default eject delay is 0 seconds. The BSAT will save Eject delay change in memory.

Transmission delay: Transmission delay time is also programmable. Transmission will be delayed by transmission delay entered by user. Transmission delay of 0 seconds is to be used in aloha transmission.

Erase memory: By this utility, all the records stored in memory can be erased. It will also erase first GPS lock time and parameters. After erasing memory, the BSAT will store record form $0^{th}$ record. Otherwise it append the data each time power is ON Device ID: Separate device id can be set for different MSS terminals (Mobile Satellite Services) using GUI software. Device id can be set from GUI.

Battery Status: Internal battery voltage and status can be read by using the 'Battery' button form GUI. A law or Med. indicates the need for charging. Charging of battery may take 10 to 14 hours. Battery can be charged without opening the BSAT. The BSAT has to be kept on the BSAT charger. While charging the Battery, all above said activities can be carried out.

BAUD RATE SETTING: PC communication baud rate can be set from 4800 to 38400 bps.

SYSTEM POWER OFF: The BSAT can only be powered off using "Power off" command.

In mission mode, BSAT powers ON when the vehicle comes in contact with water. After power ON, the BSAT waits for data or command from the vehicle for a pre-defined period of time. The pre-defined period of time may be programmable by an authorized person and may vary from 0 to 240 seconds. First, the BSAT will check for two header bytes. Upon getting the header bytes, the subsequent data will be acquired until next header bytes. If no command or information data is received during this period, then the BSAT considers it as time out and enters into transmission mode. After information data or command is received, the BSAT waits for a few seconds for the next reception; otherwise the BSAT will enter into transmission mode. The BSAT stores each record as a predetermined number of bytes headed by two header bytes. With each power ON, the BSAT appends the data. The BSAT stores the records from last record onwards till the memory is exhausted. On detection of ejection command or the IR data receive timeout, the BSAT starts acquisition of GPS data and transmits the critical data and GPS information of the vehicle to a satellite using a suitable band such as S band. The BSAT will turn on the GPS receiver and wait for GPS lock. Red LED will blink twice—indicating GPS power on. The BSAT will wait for GPS lock for a pre-determined time, say 6 minutes. If GPS locks during that period, then the BSAT will schedule first transmission in the next time slot, say within 10 minutes. If GPS is not locked within the pre-determined time minutes then it will continue with default time and schedule first transmission. If GPS is locked, the red LED will blink 3 times. If GPS is not locked, the red LED will blink 6 times. Transmission can be scheduled in random ALOHA mode as well as continuous ALOHA mode. There will be a pre-determined number of transmissions in the time slot in random ALOHA. For example, there may be three random transmissions in 10 minute slot. Every time before transmission, the BSAT will check for GPS lock status. If GPS is locked, transmission will be done with the latest GPS parameters (Latitude, Longitude and so on). If GPS is not locked, then transmission will be done with previous GPS lock parameters. All these information will be stored in Flash memory. Transmission will continue until battery voltage reaches a pre-defined lower threshold or unit is turned off by user.

Data down load command can be given from an external device such as a handheld device, computer and so on to enter into down load mode. BSAT will send all the records stored in the memory to the external device through a suitable means such as an IR transmitter. After all the records are sent to the external device, the BSAT will turn off its power. The records may be generated in the form of a text file. In the monitor mode, the GPS information including TTFF (Time to First Fix) and acquisition time can also be retrieved from the BSAT.

Figure 6:
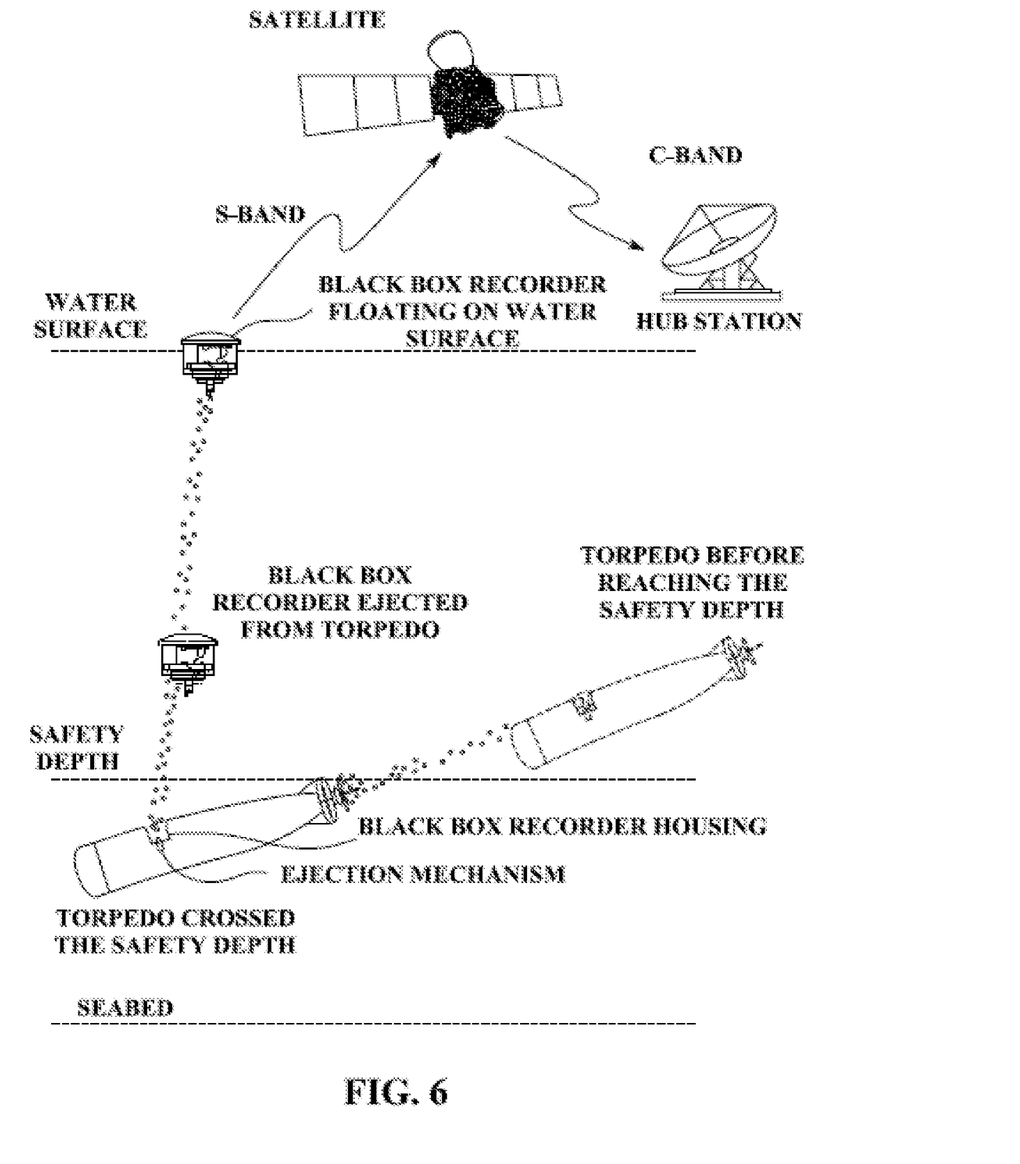
FIG. 6 depicts an exemplary implementation in a torpedo, wherein the ejection of the BSAT from a torpedo when the torpedo reaches an unsafe depth limit, according to embodiments as disclosed herein.

FIG. 6 depicts an exemplary implementation in a torpedo, wherein the ejection of the BSAT from a torpedo when the torpedo reaches an unsafe depth limit, according to embodiments as disclosed herein.

Because embodiments herein use satellite based communication means, embodiments herein over comes the hurdles involved in conventional beacons like line of sight and day light visibility. Upon recovery of the BSAT, embodiments herein enable retrieval of the data by giving a down load command through IR link form PC. The data will be received and formatted in terms of records. Each record comprises of a predetermined number of bytes including two header bytes. The formatted records can be processed to generate a file parameter wise. This data reveals information pertaining to pre, present and post disaster which will be useful to the disaster investigating team for analyzing the safety issues, motor performance and all other sub system performance.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the embodiments as described herein.

We claim:

1. A Black box with Satellite Transmitter (BSAT) for an underwater vehicle the BSAT comprising:
   a sealed enclosure, having a top cover mounted on a bottom base, to receive and transmit at least one of infrared (IR) and electromagnetic signals, the sealed enclosure comprises a housing mechanism connectable to the vehicle;
   a Global Positioning System (GPS) with an antenna configured inside the enclosure, to provide plurality of GPS parameters of the BSAT;
   a transmit antenna configured inside the enclosure, to transmit the GPS parameters associated with the BSAT and plurality of parameters associated with the underwater vehicle;
   an electronic controller configured to perform at least one of sending control signal to the IR transceiver, communicating through the IR transceiver to acquire and store underwater vehicle parameters, identifying of ejection instant, acquiring and storing of data from the GPS, scheduling data transmission through satellite after ejection of the BSAT from the underwater vehicle;
   a memory to store data associated with the GPS and plurality of parameters associated with the underwater vehicle; and
   an ejection mechanism configured in communication with the electronic controller to eject the BSAT from the vehicle on detecting a pre-defined condition by the electronic controller.

2. The BSAT as claimed in claim 1, wherein the BSAT further comprises a conducting logic with plurality of pins configured on the sealed enclosure, to enable recharging of an internal battery of the BSAT.

3. The BSAT as claimed in claim 2, wherein the conducting logic is configured to provide power to the BSAT, when the BSAT is in contact with water.

4. The BSAT as claimed in claim 1, wherein the enclosure is made of an infrared (IR) and electromagnetic transparent material to perform one of receive and transmit of electromagnetic signals and infrared signals.

5. The BSAT as claimed in claim 1, wherein the GPS parameters of the BSAT are latitude and longitude information.

6. The BSAT as claimed in claim 1, wherein the transmit antenna transmits the parameters of the BSAT to a hub station using a satellite.

7. The BSAT as claimed in claim 1, wherein the ejection mechanism comprises a spring to lock the BSAT to the vehicle and a squib to unlock the spring of the BSAT from the vehicle on detecting the pre-defined condition.

8. The BSAT as claimed in claim 1, wherein the pre-defined condition for activating ejection mechanism is depth of the vehicle with reference to a sea level.

9. The BSAT as claimed in claim 1, wherein the BSAT is configured with positive buoyancy to float in water.

10. The BSAT as claimed in claim 1, wherein the data stored in the memory is configured to be retrievable by an external device.

11. The BSAT as claimed in claim 1, wherein the BSAT further comprises an infrared (IR) transceiver configured to communicate with any other vehicle.

12. The BSAT for an underwater vehicle, as claimed in claim 1, wherein the BSAT is further configured by an external device to monitor health status of the BSAT.

* * * * *